United States Patent [19]

Son

[11] Patent Number: 5,759,885
[45] Date of Patent: Jun. 2, 1998

[54] METHOD FOR FABRICATING CMOSFET HAVING LDD STRUCTURE

[75] Inventor: Jeong Hwan Son, Daejen-si, Rep. of Korea

[73] Assignee: LG Semicon Co., Ltd., Chungcheongbuk-Do, Rep. of Korea

[21] Appl. No.: 845,485

[22] Filed: Apr. 25, 1997

[30] Foreign Application Priority Data

Dec. 14, 1996 [KR] Rep. of Korea ............ 65658/1996

[51] Int. Cl.$^6$ .................................. H01L 21/8238
[52] U.S. Cl. ................... 438/230; 438/199; 438/304; 438/305; 438/307; 438/558; 438/564; 438/224
[58] Field of Search ................ 438/199, 230, 438/303, 304, 305, 306, 307, 558, 564, 204, 217, 322, 324, 224

[56] References Cited

U.S. PATENT DOCUMENTS 5,506,161  4/1996  Orlowski et al. ................ 438/304

OTHER PUBLICATIONS

Mizuki Ono et al., "Sub–50 NM Gate Length N–MOSFETS with 10 NM Phosphorous Source and Drain Junctions," IEDM 93 pp. 119–122.

M. Saito et al., "An SPDD P-MOSFET Structure Suitable for 0.1 and Sub 0.1 Micron Channel Length and its Electrical Characteristics," IEDM 92, pp. 897–900.

Mitsuhiro Togo et al., "Novel Deep Sub–Quarter Micron PMOSFETs with Ultra-shallow Junctions Utilizing Boron Diffusion from Poly-Si/Oxide (BDSOX)," 1994 Symposium on VLSI Technology Digest of Technical Papers, pp. 21–22.

*Primary Examiner*—John Niebling
*Assistant Examiner*—Long Pham
*Attorney, Agent, or Firm*—Morgan, Lewis & Bockius LLP

[57] ABSTRACT

A method for fabricating a CMOSFET includes the steps of forming a first well of a first conduction type and a second well of a second conduction type on a substrate of the first conduction type; forming gate electrodes having sides on the first well and the second well; forming semiconductor sidewall spacers of the first conduction type at the sides of the gate electrodes; forming a semiconductor layer of the second conduction type over the first well; implanting impurity ions of the first conduction type into the second well; and annealing the semiconductor substrate to form lightly doped shallow impurity regions of the first conduction type in the first and second wells under the semiconductor sidewall spacers, and heavily doped deep impurity regions of the second conduction type in the first well, and simultaneously activating the impurity ions in the second well to formed heavily doped deep impurity regions of the first conduction type in the second well.

23 Claims, 7 Drawing Sheets

5,759,885

METHOD FOR FABRICATING CMOSFET HAVING LDD STRUCTURE

This application claims the benefit of Korean Application No. 65658/1996 filed Dec. 14, 1996, which is hereby incorporated by reference.

BACKGROUND OF THE INVENTION

1. Field of the Invention

The present invention relates to a CMOSFET, and more particularly, to a method for fabricating a CMOSFET useful for simplifying its processes and improving short channel effects.

2. Discussion of the Related Art

A metal oxide semiconductor (MOS) technique was invented by a company known as "Fairchild" in 1958. In this technique, the surface of a semiconductor is treated with a silicon oxide layer having good insulating characteristics. The MOS technique is an innovative improvement for transistor characteristics and fabricating methods. It has encouraged commercialization of semiconductor surface devices and finally led to the introduction of field effect transistors (FET) by Texas Instruments Co. for the first time in 1962.

A P-MOS, a n-MOS, and a CMOS are all MOSFET devices. In the beginning, P-MOS devices were widely used since they could be relatively easily controlled in manufacture of integrated circuits and then consume relatively low power. Later, as speed of devices became more important, n-MOS devices using electrons were used because the mobility speed of a carrier is 2.5 times faster than that of a hole. Although a CMOS device is inferior to a p-MOS device or an n-MOS device due to its low device packing density and complicated fabricating processes, it is superior because of its low consumption of power. Recently, an n-MOS is used as a memory part of a device and a CMOS device is used as a periphery circuit part.

Sizes of such MOS devices, particularly channel lengths, have been reduced for higher integration and higher speed. The shorter a channel length, the larger a drain depletion region. Thus, since a drain depletion region is increased due to a shortened channel length, a drain induced barrier lowering (DIBL) for lowering a potential barrier is generated. In addition, since source depletion regions and drain depletion regions are enlarged, punch-through effects are generated in which the source and drain depletion regions meet each other, thereby increasing leakage currents. It has been known that ion implantation below a channel region is very effective to prevent DIBL or punch-through effects. Also, since a gap between a source region and a drain region becomes narrower, electrons applied from the source region are accelerated by a hot electron field adjacent to an edge of a drain junction, causing a hot-carrier to take place. As a result, the structure of the device becomes weak.

When a hot-carrier is implanted into a gate insulating layer, it flows toward a substrate therebelow, causing a significant substrate current. To solve this problem, a MOS transistor having a lightly doped drain (LDD) structure has been proposed. Although maintaining a shortened channel length, it is an improvement from a conventional MOS transistor that is poor against a hot-carrier.

One of the features of an LDD structure is that a lightly doped self-aligned impurity region (an LDD region) is positioned between a channel region and a heavily doped impurity region (source/drain regions). Such a lightly doped impurity region causes a hot electron field to spread out around the drain junction so that a carrier applied from the source may not be abruptly accelerated in spite of an applied high voltage. As a result, the problem of poor current drivability caused by the hot-carrier is solved.

Characteristics of a device are affected by a hot-carrier because of the fact that, since an electron brings about impact ionization more easily than a hole, an n-MOS device causes bigger hot-carrier problems than a p-MOS device. In other words, it is easier for an electron to cause a hot-carrier than for a hole.

One of the methods for forming an LDD region is by ion implantation. Another method is by ion diffusion. Such an LDD region has to be highly doped to have a good controllability. If the LDD region is lightly doped, a resistance in the LDD region acts as a parasitic resistance, thus reducing drive current. In contrast, if the LDD region is heavily doped, short channel effects are suppressed and high drivability is obtained. At this time, the junction must be ultra shallow and have a low resistance.

When an ion implantation method is used to form an ultra shallow junction, it is rarely possible to form a junction not more than 50 nm deep. In contrast, when an ion diffusion method is used, it is possible to form a junction not more than 30–40 nm.

A conventional method for fabricating a p-MOSFET is illustrated with reference to FIGS. 1A–1E.

As shown in FIG. 1A, a field oxide layer 2 is formed on an n-type semiconductor substrate 1. A gate oxide layer 3 and a polysilicon layer are formed on the entire surface of the substrate 1 and patterned, thus forming a gate electrode 4.

Referring to FIG. 1B, a boron-silicate glass (BSB) layer 5 is deposited on the entire surface including the gate electrode 4.

Referring to FIG. 1C, the BSG layer 5 is etched back using a reactive ion etch (RIE) process, thus forming sidewall spacers 5a on the sides of the gate electrode 4 and the sides of the gate oxide layer 3.

Referring to FIG. 1D, either B ions or $BF_2$ ions are implanted into the surface of the semiconductor substrate 1 using the gate electrode 4 and the sidewall spacers 5a as a mask.

As shown in FIG. 1E, the entire surface of the semiconductor substrate 1 is annealed to diffuse the boron ions of the sidewall spacers 5a into the substrate 1, thereby forming a lightly doped ultra shallow impurity region 6. Simultaneously, the implanted B ions or $BF_2$ ions are activated to form a heavily doped deep impurity region 7 to be used as a source/drain region. This completes a conventional p-MOSFET.

A conventional method for fabricating an n-MOSFET is illustrated with reference to FIGS. 2A–2E.

As shown in FIG. 2A, a field oxide layer 11 is formed on a semiconductor substrate 10. Next, on the substrate 10, a gate oxide layer 12 and a polysilicon layer are formed. The gate oxide layer 12 and the polysilicon layer are patterned with a photolithography process and a photo etching process, thereby forming a gate electrode 13.

As shown in FIG. 2B, a phosphorus-silicate glass (PSG) layer 14 is deposited on the entire surface of the substrate including the gate electrode 13.

As shown in FIG. 2C, the PSG layer 14 is then etched back to form sidewall spacers 14a on both of the sides of the gate electrode 13.

Referring to FIG. 2D, P ions or As ions are implanted into the substrate 10 by using the gate electrode 13 and the sidewall spacers 14a as a mask.

Referring to FIG. 2E, the entire surface of the substrate 10 is annealed to diffuse the P ions of the sidewall spacers 14a into the substrate 10, thus forming a lightly doped ultra shallow impurity region 15. Simultaneously, the implanted P ions or the implanted As ions are activated to form a heavily doped deep impurity region 16 to be used as a source/drain region. This completes a conventional n-MOSFET.

The conventional method for forming a lightly doped ultra shallow impurity region has the following problems. By using a solid phase diffusion method, short channel effects are suppressed and a parasitic resistance is diminished, resulting in high drivability. However, since the fabrication processes for a p-MOSFET and an n-MOSFET are carried out separately, the fabrication process for a CMOSFET is difficult and very complicated.

SUMMARY OF THE INVENTION

Accordingly, the present invention is directed to a method for fabricating a CMOSFET that substantially obviates one or more of the problems due to limitations and disadvantages of the related art.

An object of the invention is to provide a method for fabricating a CMOSFET with simplified process and improved short channel effects.

Another object of the invention is to provide a method for fabricating a CMOSFET in which a lightly doped ultra shallow impurity region is simultaneously formed in both an n-MOS and p-MOS to simplify process steps and in which short channel effects are improved by using a halo structure.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the method for fabricating a CMOSFET of the present invention includes the steps of selectively forming a first conduction type well and a second conduction type well in a first conduction type semiconductor substrate; forming a gate electrode having a gate insulating layer and a cap insulating layer on a predetermined portion of each of the first conduction type well and the second conduction type well; forming an insulating layer on the entire surface of the semiconductor substrate including the sides of the gate electrodes; forming a first conduction type semiconductor layer on the entire surface of the substrate including the insulating layer; selectively etching the first conduction type semiconductor layer and the insulating layer so as to form sidewall spacers on the sides of the gate electrodes; selectively forming a second conduction type semiconductor layer over the first conduction type well; selectively implanting a first conduction type impurity ions into the second conduction type well; and annealing the entire surface of the substrate so as to form first conduction type lightly doped shallow impurity regions in the first conduction type well and second conduction type well under the sidewall spacers, and second conduction type heavily doped deep impurity regions in the first conduction type well under the second conduction type semiconductor layer, and simultaneously activating the first conduction type impurity ions of the second conduction type well so as to form first conduction type heavily doped deep impurity regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Referring to FIGS. 3A–3H, a method for fabricating a CMOSFET in accordance with a preferred embodiment of the invention will now be described.

Figure 1A:
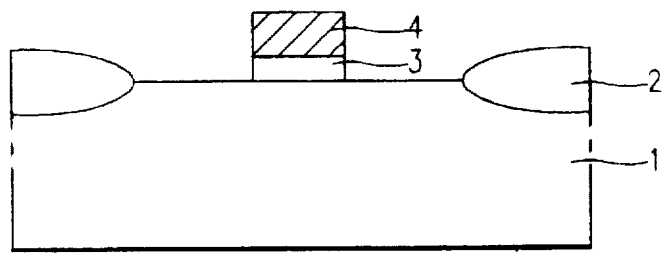
FIGS. 1A–1E are cross-sectional views showing a conventional method for fabricating a p-MOSFET.
Figure 1B:
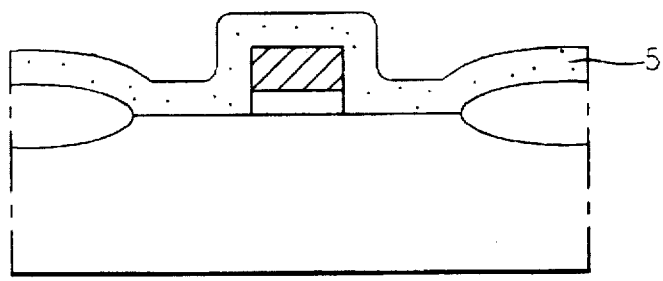
Figure 1C:
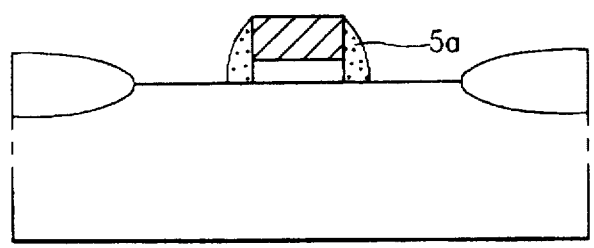
Figure 1D:
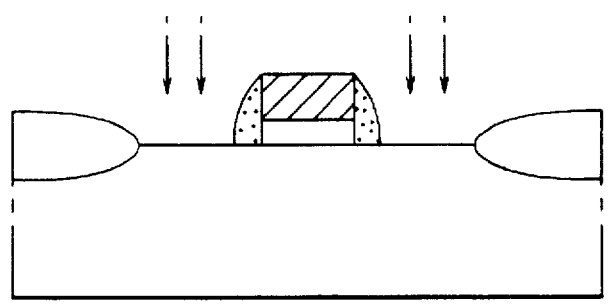
Figure 1E:
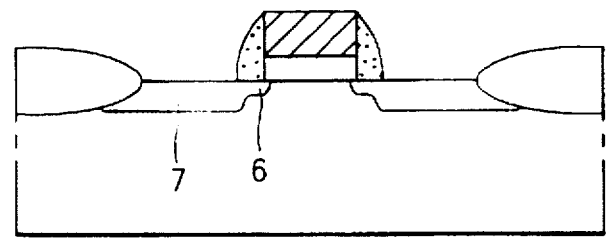
Figure 2A:
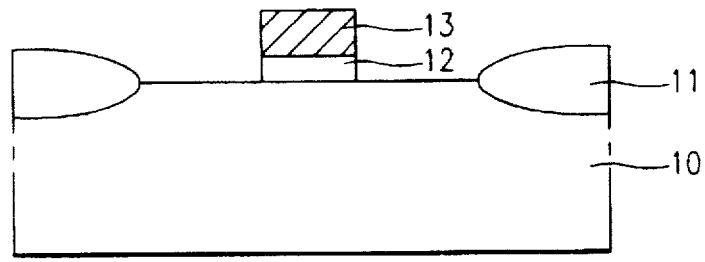
FIGS. 2A–2E are cross-sectional views showing a conventional method for fabricating an n-MOSFET.
Figure 2B:
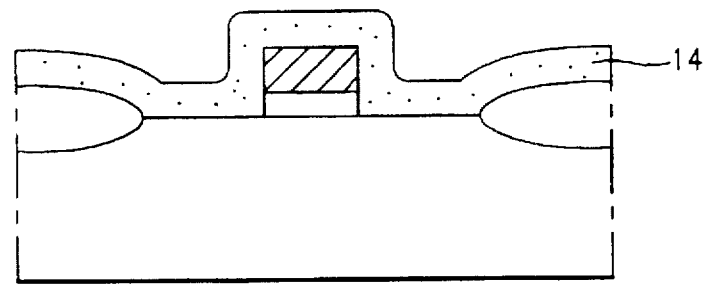
Figure 2C:
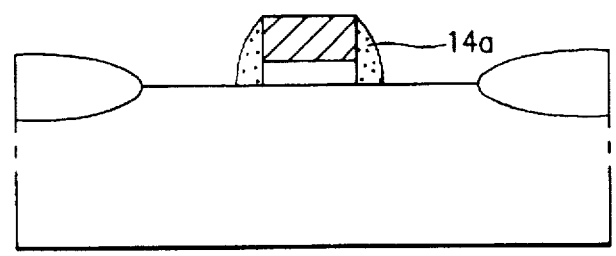
Figure 2D:
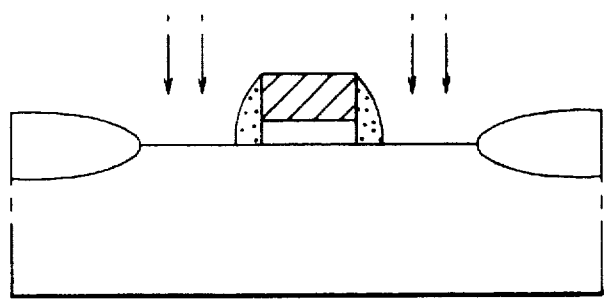
Figure 2E:
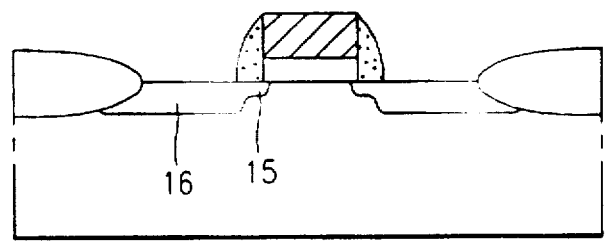
Figure 3A:
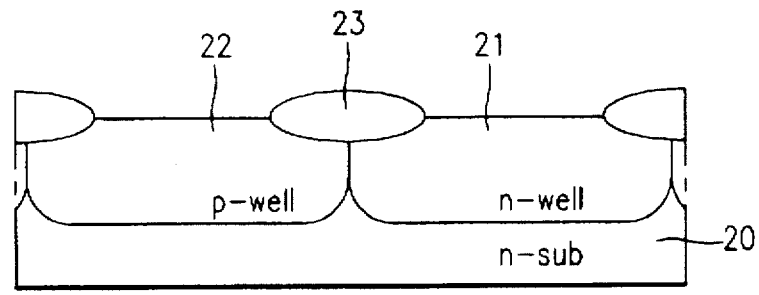
FIGS. 3A–3H are cross-sectional views showing a method for fabricating a CMOSFET in accordance with a preferred embodiment of the invention.

As shown in FIG. 3A, a p-type well 22 and an n-type well 21 are formed on an n-type semiconductor substrate 20. A field oxide layer 23 is then selectively formed on the P-type well 22 and the n-type well 21.

Figure 3B:
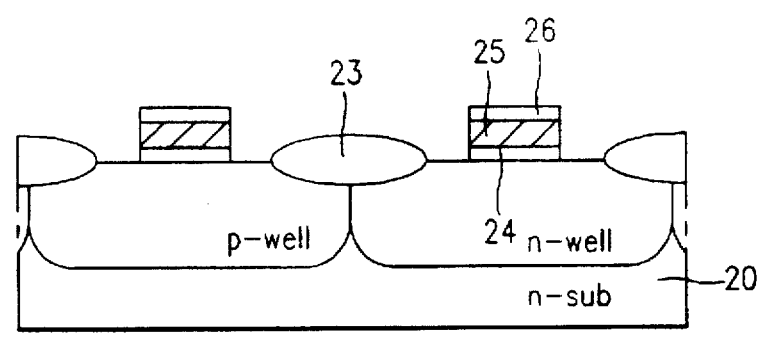

Referring to FIG. 3B, on the substrate 20, a gate insulating layer 24, a polysilicon layer, and a cap insulating layer 26 are sequentially formed. The gate insulating layer 24, the polysilicon layer, and the cap insulating layer 26 are then patterned, e.g., through photolithography and photo etching, to form a gate electrode 25. Here, the gate electrode 25 may be formed of a polycide by depositing a metal of a high melting point on the upper portion of the polysilicon. The cap insulating layer 26 may be formed of either an oxide or a nitride, having a thickness in the range of about 500–2000 Angstroms.

Figure 3C:
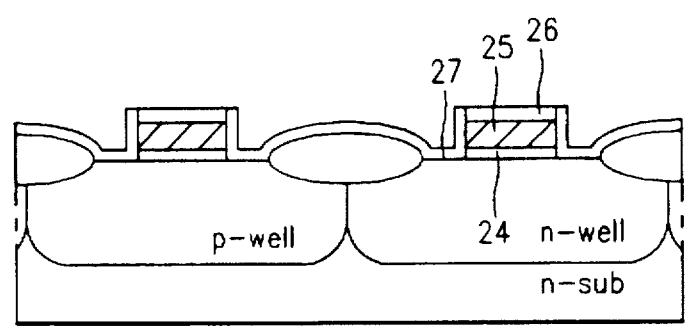

Referring to FIG. 3C, an insulating layer 27 is formed on the entire surface of the substrate 20 including the sides of the gate electrode 25. Here, a thermal oxidation precess is applied to the substrate 20 so that the insulating layer 27, which is a thermal oxide layer, is formed. The insulating layer 27 has a thickness of about 50–100 Angstroms.

Figure 3D:
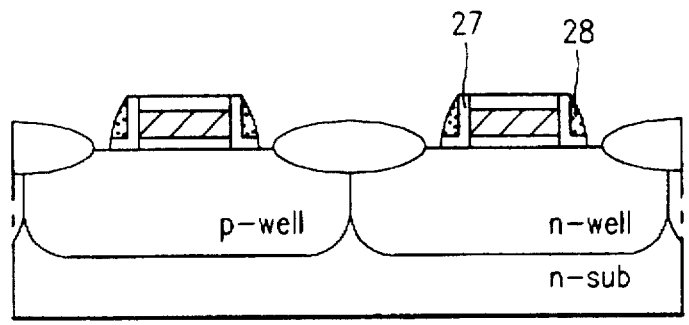

Referring to FIG. 3D, a phosphorus-doped polysilicon layer is deposited on the gate electrode 25 and the insulating layer 27 and then is subjected to etch back with an RIE, thereby forming sidewall spacers 28 on the sides of the gate electrode 25. At this time, the insulating layer 27 is also etched to expose the substrate 20. Alternatively, instead of the phosphorus doped polysilicon layer, a phosphorus-silicate glass (PSG) layer may be formed with a thickness of about 500–2000 Angstroms. A concentration of phosphorus contained in the phosphorus doped polysilicon layer or the PSG layer is about $1 \times 10^{18} - 1 \times 10^{23}$ cm$^{-3}$.

Figure 3E:
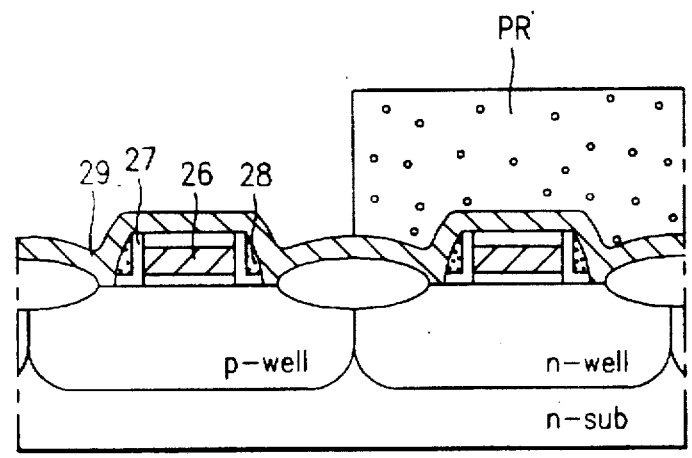

Referring to FIG. 3E, a boron-silicate glass (BSG) layer 29 and a photoresist layer (PR) are coated on the entire surface of the substrate 20 including the gate electrode 25 and the sidewall spacers 28. The photoresist layer over the p-type well 22 is then subjected to exposure and development to be patterned. Alternatively, instead of the BSG layer deposited on the entire surface of the substrate including the gate electrode 25 and the sidewall spacers 28, boron doped polysilicon or boron implanted polysilicon may be used. Here, the BSG layer 29 or the polysilicon layer including boron is formed to have a thickness of about 500–3000 Angstroms and a concentration of about $1\times10^{19}$–$1\times10^{23}$ cm$^{-3}$.

Figure 3F:
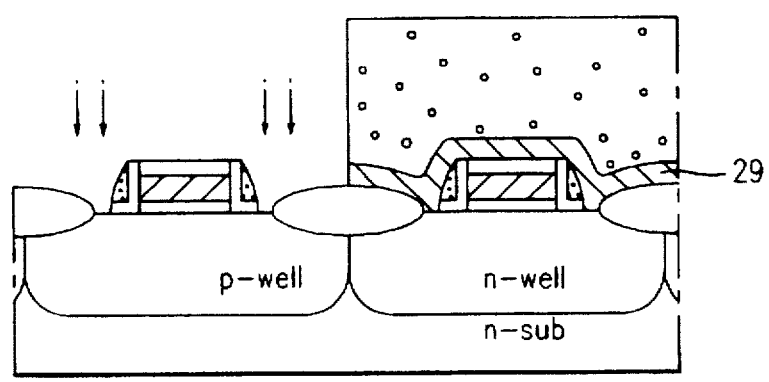

Referring to FIG. 3F, with the remaining photoresist layer (PR) serving as a mask, the BSG layer 29 on the p-type well 22 is selectively removed. Accordingly, the BSG layer 29 on the n-type well 21 remains. Next, with the gate electrode 25 and the sidewall spacers 28 as masks, n-type heavily doped ions are implanted into the exposed area of the p-type well 22. It is Preferable that As ions are implanted here with an ion implantation energy of about 5–20 KeV and a dose of about $1\times10^{14}$–$1\times10^{15}$ cm$^{-2}$.

Figure 3G:
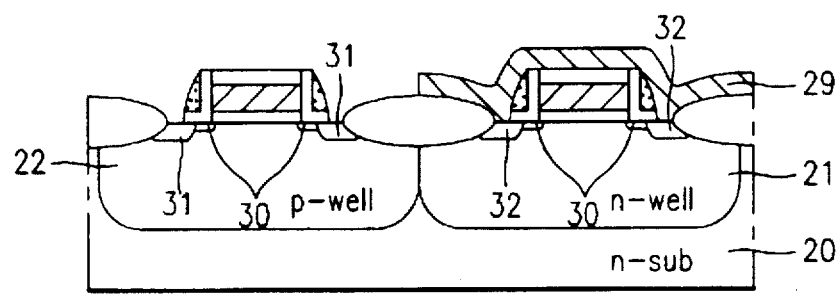

Referring to FIG. 3G, the remaining photoresist layer is removed. A rapid thermal annealing (RTA) is carried out at a temperature of about 850°–1050° C. for a period of approximately 5–60 seconds. During this annealing process, the phosphorus ions of the sidewall spacers 28, which is formed of phosphorus doped polysilicon, are diffused in a solid phase into the n-type well 21 and the p-type well 22 of the substrate 20 by penetrating the gate insulating layer 24. As a result, an ultra shallow n junction is formed in the n-type well 21 and the p-type well 22, thereby forming an ultra shallow n-type lightly doped impurity region 30. Here, the ultra shallow n-type lightly doped impurity region 30 is formed to have a concentration of not less than $5\times10^{19}$ cm$^{-3}$. Simultaneously, the As ions implanted into the p-type well 22 are activated to form a deep n-type heavily doped impurity region 31. As a result, the deep n-type heavily doped impurity region 31 and the lightly doped ultra shallow impurity region 30 become source/drain regions of an n-MOSFET. Also simultaneously, the boron ions of the BSG layer 29 over the n-type well 21 are diffused into the n-type well 21, thus forming a deep p-type heavily doped impurity region 32. As a result, the deep p-type heavily doped impurity region 32 and the ultra shallow n-type lightly doped impurity region 30 become source/drain regions of a p-MOSFET. In this case, the source/drain region of the p-MOSFET has a halo structure which includes the deep p-type heavily doped impurity region 32 and the ultra shallow n-type lightly doped impurity region 30. Since the p-MOS device is much stronger against a hot-carrier than the n-MOS device, the halo structure can prevent punch-through effects.

Figure 3H:
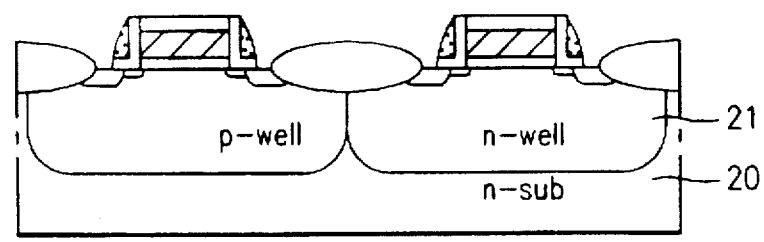

As seen in FIG. 3H, the BSG layer 29 is removed, thereby completing the CMOSFET including both the n-MOSFET and the p-MOSFET.

The method for fabricating a CMOSFET according to the present invention has the following advantages. First, during the solid phase diffusion (SPD) process, sidewall spacers are utilized to form lightly doped ultra shallow impurity regions of the n-MOSFET and p-MOSFET simultaneously. This leads to the simplified process and reduces the number of inferior devices produced. This also improves the reliability of devices and increase the production yield. Second, since the source/drain regions of the p-MOSFET have a halo structure, punch-through can be prevented, thereby improving short channel effect and device reliability.

It will be apparent to those skilled in the art that various modification and variations can be made in the method for fabricating a CMOSFET of the present invention without departing from the spirit or scope of the inventions. Thus, it is intended that the present invention cover the modifications and variations of this invention provided they come within the scope of the appended claims and their equivalents.

What is claimed is:

1. A method for fabricating a CMOSFET comprising the steps of:

selectively forming a first well of a first conduction type and a second well of a second conduction type on a semiconductor substrate of the first conduction type;

forming gate electrodes having a gate insulating layer and a cap insulating layer on a portion on each of the first well and the second well;

forming an insulating layer on the semiconductor substrate including sides of the gate electrodes;

forming a first semiconductor layer of the first conduction type on the semiconductor substrate including the insulating layer;

selectively etching the first semiconductor layer and the insulating layer to form sidewall spacers at the sides of the gate electrodes;

selectively forming a second semiconductor layer of the second conduction type over the first well;

selectively implanting impurity ions of the first conduction type into the second well; and annealing the semiconductor substrate to form lightly doped shallow impurity regions of the first conduction type in the first and second wells under the sidewall spacers, and heavily doped deep impurity regions of the second conduction type in the first well under the second semiconductor layer, and simultaneously activating the impurity ions in the second well to form heavily doped deep impurity regions of the first conduction type.

2. The method as claimed in claim 1, wherein the first conduction type is n-type and the second conduction type is p-type.

3. The method as claimed in claim 1, wherein the gate electrode is formed of one of polysilicon and polycide.

4. The method as claimed in claim 1, wherein the cap insulating layer is formed of one of oxide and nitride.

5. The method as claimed in claim 1, wherein the cap insulating layer is formed to have a thickness of about 500–2000 Angstroms.

6. The method as claimed in claim 1, wherein the step of forming the insulating layer includes applying a thermal oxidation process to an entire surface of the semiconductor substrate.

7. The method as claimed in claim 1, wherein the insulating layer is formed to have a thickness of about 50–100 Angstroms.

8. The method as claimed in claim 1, wherein the first semiconductor layer is formed of phosphorus doped polysilicon.

9. The method as claimed in claim 1, wherein the first semiconductor layer is formed of phosphorus-silicate-glass.

10. The method as claimed in claim 1, wherein the first semiconductor layer is formed to have a thickness of about 500–2000 Angstroms.

11. The method as claimed in claim 1, wherein the first semiconductor layer has a n impurity concentration of about $1\times10^{18}$–$1\times10^{23}$ cm$^{-3}$.

12. The method as claimed in claim 1, wherein the second semiconductor layer is formed of boron-silicate-glass.

13. The method as claimed in claim 1, wherein the second semiconductor layer is formed of boron doped polysilicon.

14. The method as claimed in claim 1, wherein the second semiconductor layer is formed of boron implanted polysilicon.

15. The method as claimed in claim 1, wherein the second semiconductor layer is formed to have a thickness of about 500–3000 Angstroms.

16. The method as claimed in claim 1, wherein the second semiconductor layer is formed to have an impurity concentration of about $1\times10^{19}$–$1\times10^{23}$ cm$^{-3}$.

17. The method as claimed in claim 1, wherein the impurity ions of the first conduction type are As ions.

18. The method as claimed in claim 17, wherein a dose of the impurity ions implanted into the second well is about $1\times10^{14}$–$1\times10^{15}$ cm$^{-2}$.

19. The method as claimed in claim 17, wherein an ion implantation energy of the impurity ions is approximately between and 20 KeV.

20. The method as claimed in claim 1, wherein the step of annealing is performed through a rapid thermal annealing.

21. The method as claimed in claim 20, wherein the rapid thermal annealing is carried out at a temperature of about 850°–1050° C. for a period of approximately 5–60 seconds.

22. The method as claimed in claim 1, wherein the lightly doped impurity regions of the first conduction type have a concentration of not less than approximately $5\times10^{19}$ cm$^{-3}$.

23. A method for fabricating a CMOSFET comprising the steps of:

forming a first well of a first conduction type and a second well of a second conduction type on a substrate of the first conduction type;

forming gate electrodes having sides on the first well and the second well;

forming semiconductor sidewall spacers of the first conduction type at the sides of the gate electrodes;

forming a semiconductor layer of the second conduction type over the first well;

implanting impurity ions of the first conduction type into the second well; and annealing the semiconductor substrate to form lightly doped shallow impurity regions of the first conduction type in the first and second wells under the semiconductor sidewall spacers, and heavily doped deep impurity regions of the second conduction type in the first well, and simultaneously activating the impurity ions in the second well to formed heavily doped deep impurity regions of the first conduction type in the second well.

* * * * *

UNITED STATES PATENT AND TRADEMARK OFFICE
CERTIFICATE OF CORRECTION

PATENT NO. : 5,759,885
DATED : June 2, 1998
INVENTOR(S) : Son

It is certified that error appears in the above-identified patent and that said Letters Patent is hereby corrected as shown below:

Column 7, line 17, change "between and" to --between 5 KeV and--.

Signed and Sealed this

Second Day of March, 1999

Attest:

Q. TODD DICKINSON

*Attesting Officer*  *Acting Commissioner of Patents and Trademarks*